United States Patent
Chiang et al.

(10) Patent No.: US 12,328,965 B2
(45) Date of Patent: Jun. 10, 2025

(54) IN-SITU CAP FOR GERMANIUM PHOTODETECTOR

(71) Applicant: Taiwan Semiconductor Manufacturing Company, Ltd., Hsinchu (TW)

(72) Inventors: Chen-Hao Chiang, Jhongli (TW); Eugene I-Chun Chen, Taipei (TW); Chih-Ming Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/592,715

(22) Filed: Mar. 1, 2024

(65) Prior Publication Data
US 2024/0204120 A1    Jun. 20, 2024

Related U.S. Application Data

(62) Division of application No. 17/197,353, filed on Mar. 10, 2021, now Pat. No. 11,949,030.
(Continued)

(51) Int. Cl.
*H10F 77/122* (2025.01)
*H10F 30/221* (2025.01)
(Continued)

(52) U.S. Cl.
CPC ......... *H10F 77/122* (2025.01); *H10F 30/221* (2025.01); *H10F 30/223* (2025.01);
(Continued)

(58) Field of Classification Search
CPC . H01L 31/028; H01L 31/0203; H01L 31/103; H01L 31/105; H01L 31/1808;
(Continued)

(56) References Cited

U.S. PATENT DOCUMENTS 6,075,253 A    6/2000 Sugiyama et al.
9,806,112 B1 *  10/2017 Celo ............... H01L 31/105
(Continued)

FOREIGN PATENT DOCUMENTS

JP    2013083680 A    5/2013
WO   2018191539 A1    10/2018

OTHER PUBLICATIONS

Non-Final Office Action dated Jun. 22, 2023 for U.S. Appl. No. 17/197,353.
(Continued)

*Primary Examiner* — Jonathan Han
(74) *Attorney, Agent, or Firm* — Eschweiler & Potashnik, LLC

(57) ABSTRACT

Various embodiments of the present disclosure are directed towards an optoelectronic device. The device includes a substrate, and a germanium photodiode region extending into an upper surface of the substrate. The germanium photodiode region has a curved upper surface that extends past the upper surface of the substrate. A silicon cap overlies the curved upper surface of the germanium photodiode region. There is an absence of oxide between the curved upper surface of the germanium photodiode region and an upper surface of the silicon cap.

20 Claims, 9 Drawing Sheets

Related U.S. Application Data

(60) Provisional application No. 63/106,019, filed on Oct. 27, 2020.

(51) Int. Cl.
*H10F 30/223* (2025.01)
*H10F 71/00* (2025.01)
*H10F 77/50* (2025.01)

(52) U.S. Cl.
CPC ....... *H10F 71/1212* (2025.01); *H10F 71/129* (2025.01); *H10F 77/50* (2025.01)

(58) Field of Classification Search
CPC ......... H01L 31/1868; H01L 31/035281; H01L 31/02161; H01L 27/1443; H01L 27/14607; H01L 27/1462; H01L 27/1463; H01L 27/14683; H10F 77/122; H10F 30/221; H10F 30/223; H10F 71/1212; H10F 71/129; H10F 77/50; H10F 77/147; H10F 77/306; H10F 39/103; H10F 39/8027; H10F 39/011; H10F 39/805; H10F 39/807

See application file for complete search history.

(56) References Cited

U.S. PATENT DOCUMENTS

| | | |
|---|---|---|
| 2008/0227249 A1 | 9/2008 | Fan et al. |
| 2010/0006961 A1 | 1/2010 | Yasaitis et al. |
| 2012/0126357 A1* | 5/2012 | Kim ................ H01L 31/18 257/E31.011 |
| 2012/0241769 A1 | 9/2012 | Katoh |
| 2015/0340538 A1 | 11/2015 | Novack et al. |
| 2016/0043262 A1 | 2/2016 | Okumura |
| 2017/0012143 A1* | 1/2017 | Usami ............... H01L 31/105 |
| 2017/0317221 A1 | 11/2017 | Usami |
| 2022/0065692 A1 | 3/2022 | Baudot |

OTHER PUBLICATIONS

Notice of Allowance dated Dec. 8, 2023 for U.S. Appl. No. 17/197,353.

* cited by examiner

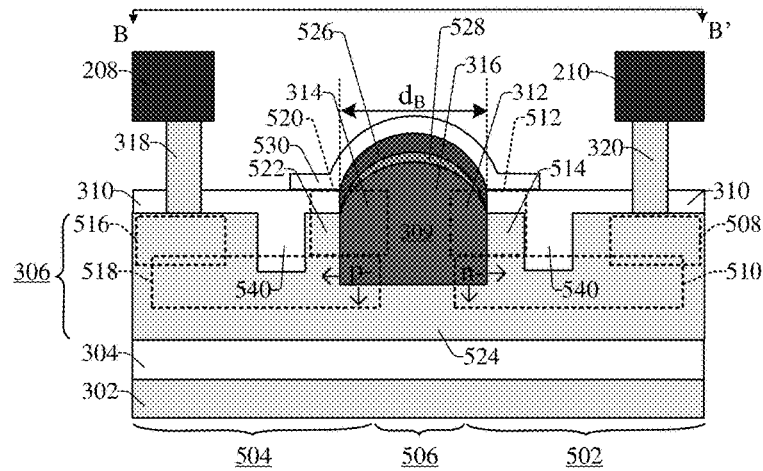 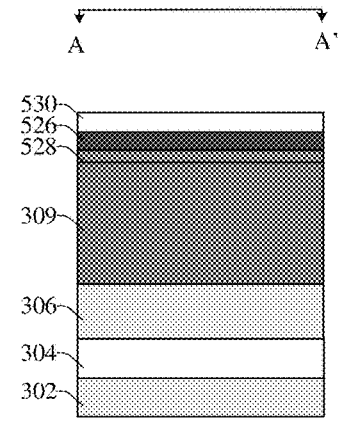
Fig. 7A  Fig. 7B
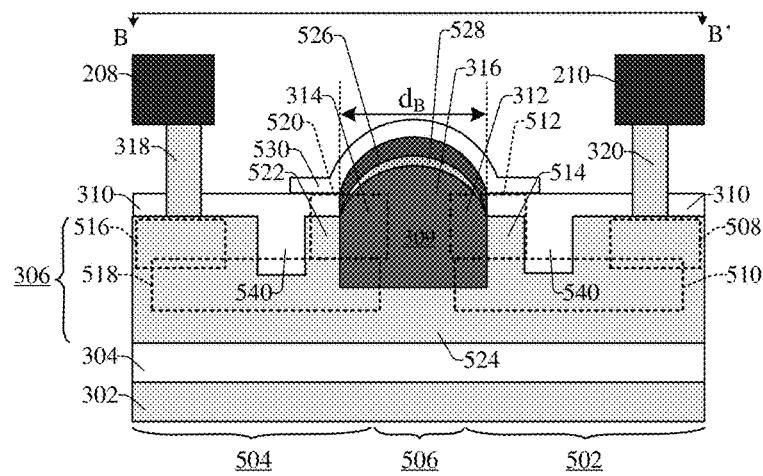 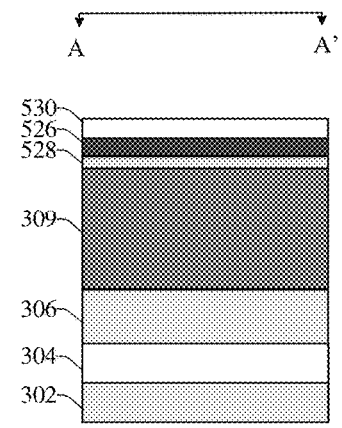
Fig. 8A  Fig. 8B

IN-SITU CAP FOR GERMANIUM PHOTODETECTOR

REFERENCE TO RELATED APPLICATIONS

This Application is a Divisional of U.S. application Ser. No. 17/197,353, filed on Mar. 10, 2021, which claims the benefit of U.S. Provisional Application No. 63/106,019, filed on Oct. 27, 2020. The contents of the above-referenced Patent Applications are hereby incorporated by reference in their entirety.

BACKGROUND

Silicon photonic devices can be made using existing semiconductor fabrication techniques, and because silicon is already used as the substrate for most integrated circuits, it is possible to create hybrid devices in which the optical and electronic components are integrated onto a single microchip. Consequently, silicon photonics is being actively researched by many electronics manufacturers, as well as by academic research groups, as a means for keeping on track with Moore's Law, by using optical interconnects to provide faster data transfer both between and within microchips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A and 7B illustrate various cross-sectional views of some embodiments of the germanium photodiode of FIG. 4.

FIGS. 8A and 8B illustrate various cross-sectional views of some embodiments of the germanium photodiode of FIG. 4.

DETAILED DESCRIPTION

Figure 1:
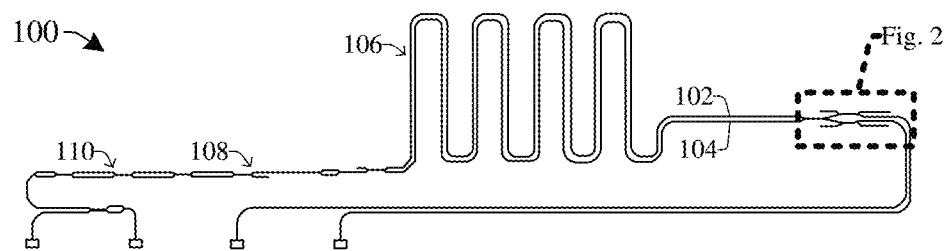
FIG. 1 illustrates an example of an optoelectronic device in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical fibers and optical waveguides include a core, and a cladding or substrate at least partially surrounding the core. The core has a core refractive index $n_1$ and the cladding has a cladding reflective index $n_0$, whereby the core refractive index is higher than the cladding reflective index. Thus, when a light beam is coupled to the optical fiber or waveguide (e.g., when the light beam is directed into an end of the optical fiber or waveguide), the light beam is confined within the core by total internal reflection as the light beam propagates down the length of the optical fiber or waveguide.

In some cases, the core comprises silicon and the cladding includes silica or silicon dioxide. A photodiode, which can be formed in a germanium photodiode region located at a predetermined location along the length of the waveguide, can be present to measure or detect light at the predetermined location. Some aspects of the present disclosure lie in the appreciation that it is advantageous to prevent the uppermost surface of the germanium photodiode region from oxidizing, as such oxidation can lead to increased dark current for the final device. In alternative approaches, a silicon nitride cap is formed over an upper surface of the germanium photodiode region to decrease or prevent such oxidation. However, the silicon nitride cap is susceptible to voids during manufacture due in part to the hardness of the silicon nitride, whereby the voids can lead to oxidation of the underlying germanium and/or the underlying germanium being attacked by chemicals in the manufacturing process. Because of this, some aspects of the present disclosure provide a silicon cap over the germanium photodiode region to eliminate or decrease oxidation. The silicon cap is formed in-situ with the germanium photodiode region, thereby preventing oxidation of the upper surface of the germanium photodiode region. Further, because the silicon cap is less hard than silicon nitride, the silicon cap is less susceptible to voids and tends to reduce dark current relative to approaches that use a silicon nitride cap. Lastly, in some embodiments, the in-situ process used to form the germanium photodiode region and the silicon cap over the germanium photodiode region can save a photomask compared to some alternative approaches.

With reference to FIG. 1, one can see an optoelectronic device 100 that includes a germanium photodiode with a silicon cap in accordance some embodiments. It will be appreciated that FIG. 1's optoelectronic device 100 is merely an example, and optoelectronic devices in accordance with this disclosure can take any number of forms, including waveguides, splitters, modulators, demodulators, couplers, de-couplers, multiplexers, de-multiplexers, transmitters, receivers, and a host of other applications. The illustrated optoelectronic device 100 includes a series of optical paths, e.g., first optical path 102 and second optical path 104, included in a waveguide. At various locations, the optical paths may run in parallel with one another (see arrow 106), may branch apart from one another (see arrow 108), or may merge with one another (see arrow 110) to facilitate desired functionality—again FIG. 1 is just an example.

Figure 2:
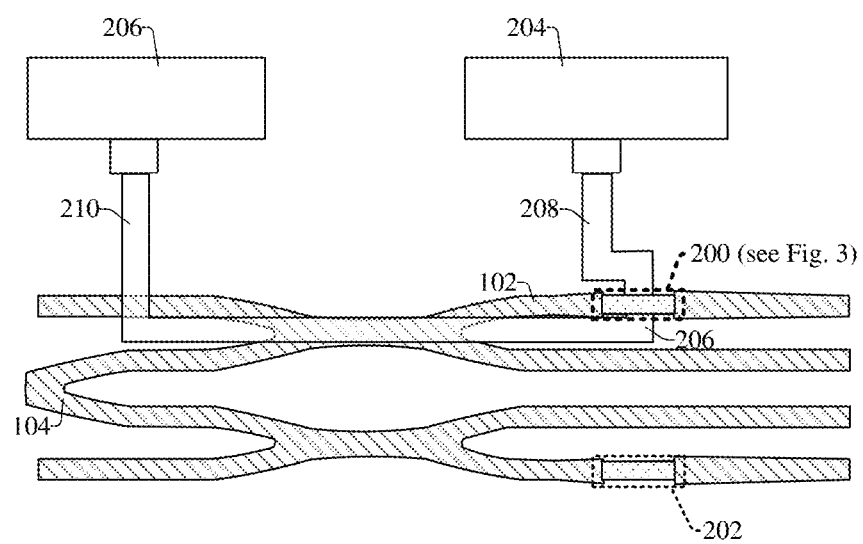
FIG. 2 illustrates an inset view of a portion of the optoelectronic device consistent with FIG. 1 in accordance with some embodiments.

FIG. 2 illustrates a more detailed view of an inset portion of FIG. 1's optoelectronic device 100 including first optical path 102 and second optical path 104. A photodiode 200 is disposed at a first predetermined location on the first optical path 102, and another photodiode 202 is disposed at another predetermined location on the second optical path 104. The photodiode 200 is coupled to two conductive metal pads, such as bond pads. More particularly, a first metal line 208 couples a cathode of the photodiode 200 to the first metal pad 204, and a second metal line 210 couples an anode of the photodiode 200 to the second metal pad 206.

Figure 3:
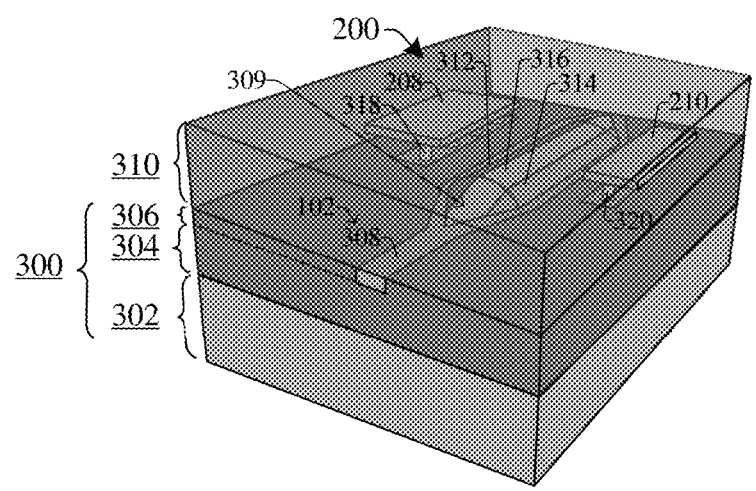
FIG. 3 illustrates a three dimensional view corresponding to a germanium photodiode consistent with some embodiments of the inset portion of FIG. 2.

FIG. 3 illustrates a three-dimensional/perspective cutaway view of the portion of FIG. 2 corresponding to the photodiode 200. As can be appreciated from FIG. 3, the optical paths (e.g., first optical path 102) can be disposed on a substrate 300, such as a silicon-on-insulator (SOI) substrate or bulk silicon substrate. In the illustrated embodiment, the substrate 300 is an SOI substrate including a handle substrate 302 comprising monocrystalline silicon, an insulator layer 304 comprising silicon dioxide, and a device layer 306 comprising silicon. A germanium photodiode region 309 is also embedded in the substrate 300. Thus, the first optical path 102 includes a core 308 comprising silicon and the germanium photodiode region 309 extending along an axis of the first optical path. A cladding, which often comprises silica or silicon dioxide, surrounds the core 308 and the germanium photodiode region 309. Thus, the cladding includes an oxide layer 310 (e.g., silicon dioxide layer) disposed over an upper surface of the core 308 and around sidewalls of the core 308, and the insulator layer 304 is disposed under the bottom surface of the core 308. The photodiode 200, which can be disposed fully or partially within the germanium photodiode region 309 and which is coupled to an end of the core 308 of the first optical path 102, can measure or detect light at a predetermined location.

To establish the photodiode 200, the germanium photodiode region 309 includes an n-type germanium region 312 and a p-type germanium region 314, and in the illustrated embodiment also includes an intrinsic germanium region 316 separating the n-type germanium region 312 and p-type germanium region 314 to establish a p-i-n germanium photodiode. In other embodiments, the intrinsic germanium region 316 could be omitted and the n-type germanium region 312 could directly contact the p-type germanium region 314 at a p-n junction. A first set of one or more contacts 318 extends downward from the first metal line 208 to an n-type silicon region ohmically coupled to the n-type germanium region 312 (e.g., to the cathode of the photodiode 200) to couple the first metal pad 206 to the cathode of the germanium photodiode 200. A second set of one or more contacts 320 extends downward from the second metal line 210 to a p-type silicon region ohmically coupled to the p-type germanium region 314 (e.g., to the anode of the photodiode) to couple the second metal pad 206 to the anode of the photodiode 200. The core 308 may widen or taper at ends of the germanium photodiode region 309 to surround outer edges of the germanium photodiode region 309, and the cladding surrounds edges of the widened silicon core to facilitate total internal reflection through the waveguide.

Figure 4:
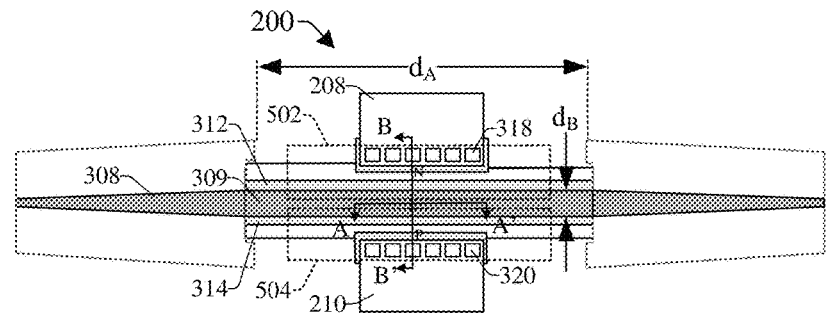
FIG. 4 illustrates a top view of some embodiments of a germanium photodiode consistent with FIG. 3.
Figure 5A:
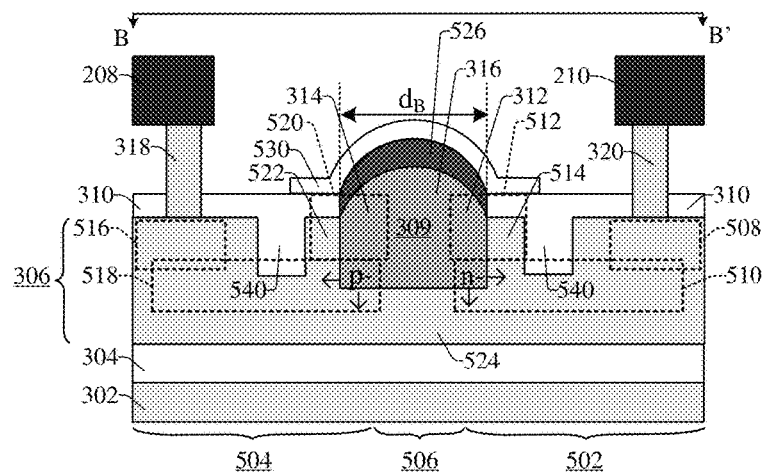
FIGS. 5A and 5B illustrate various cross-sectional views of some embodiments of the germanium photodiode of FIG. 4.
Figure 5B:
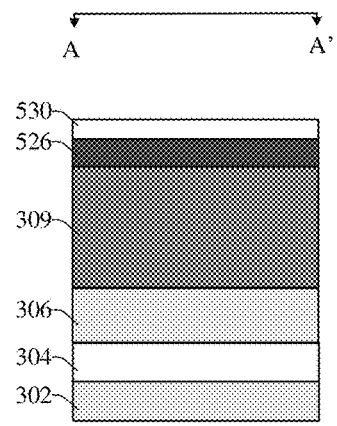

FIG. 4 shows a top view of the germanium photodiode 200 and is consistent with some embodiments of FIG. 3; and FIGS. 5A-5B which are now described concurrently with FIG. 4 illustrate cross-sectional views along the width and length of the germanium photodiode 200, respectively, as shown in FIG. 4's top view.

As shown in FIGS. 4 and 5A-5B, the germanium photodiode 200 includes n-type region 502, p-type region 504, and intrinsic region 506 separating the n-type region 502 and p-type region 504 to establish a p-i-n photodiode. In other embodiments, the intrinsic region 506 could be omitted and the n-type region 502 could directly contact the p-type region 504 at a p-n junction. The n-type region 502 can include an n-type contact region 508 directly under the contact 320, a lateral n-type region 510 extending under a shallow trench isolation (STI) structure 540, an n-type photodiode region 512 (which may include n-type germanium region 312 and n-type silicon region 514). The p-type region 504 can include a p-type contact region 516 directly under the contact 318, a lateral p-type region 518 extending under the STI structure 540, a p-type photodiode region 520 (which may include p-type germanium region 314 and p-type silicon region 522). Intrinsic germanium region 316 separates the n-type germanium region 312 and p-type germanium region 314, and intrinsic silicon region 524 separates the lateral n-type region 510 from the lateral p-type region 518, thereby establishing a p-i-n photodiode. In some embodiments, the length of the germanium photodiode region, $d_A$, ranges from approximately 5 micrometers to approximately 50 micrometers, and is 15 micrometers in some cases. In some embodiments, the width of the germanium photodiode region, $d_B$, ranges from approximately 1/50th of $d_A$ to equal to $d_A$; and is 0.5 micrometers in some embodiments.

When light passes along the first optical path within the core 308, at some point the light reaches the first predetermined location of the germanium photodiode 200. When a photon of sufficient energy strikes the germanium photodiode 200, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus holes (p-) move toward the p-type anode (and towards p-type contact region 516), and electrons (n-) move toward the n-type cathode (and towards n-type contact region 508), and a photocurrent is produced such that the magnitude of the current is proportional to the intensity of the light. The total current through the germanium photodiode 200 is the sum of the dark current (current that is generated in the absence of light) and the photocurrent, so the dark current should be minimized to maximize the sensitivity of the device.

As can be seen in FIG. 5A, the germanium photodiode region 309 has a substantially flat or level lower surface, vertical or substantially vertical sidewalls, and a curved upper surface. A silicon cap 526 is disposed over the germanium photodiode region 309, and there is an absence of oxidation between the curved upper surface of the germanium photodiode region 309 and the lower surface of the silicon cap 526. This absence of oxidation is due to the fact that the silicon cap 526 is formed in-situ with the germanium photodiode region 309 within a cluster tool, thereby preventing oxidation of the upper surface of the germanium photodiode region 309. Further, the silicon cap 526 is relatively resistant to formation of voids, and thus, prevents subsequent damage during manufacturing and thereby tends to reduce dark current relative to alternative approaches that use a silicon nitride cap. In some embodiments, the silicon cap 526 has a thickness ranging from 100 angstroms to 1000 angstroms. The silicon cap 526 has a lower surface whose outer corners meet upper surface of the device layer 306, and has an upper surface whose outer corners meet upper surface of the oxide layer 310. As illustrated in FIG. 5B, in some embodiments the silicon cap 526 extends continuously over the germanium photodiode region and has a substantially uniform thickness along the length of the germanium photodiode region. Thus, a curved lower surface of the silicon cap is congruous with the curved upper surface of the germanium photodiode region.

A protective oxide layer 530 is disposed over the silicon cap 526, and has outer edges that extend outwards past outer sidewalls of the germanium photodiode region 309 and that extend laterally over the upper surface of oxide layer 310. In some embodiments, the protective oxide layer 530 is a low-k dielectric, but the protective oxide layer 530 can also be silicon dioxide, silicon nitride, silicon oxynitride, or another suitable dielectric material.

Figure 6A:
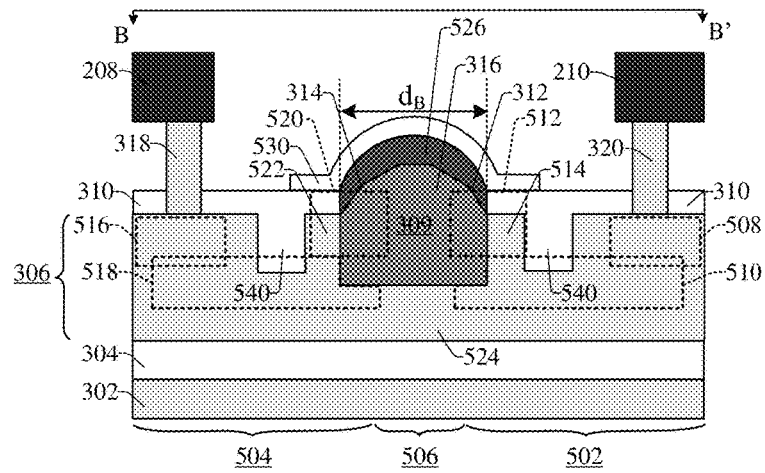
FIGS. 6A and 6B illustrate various cross-sectional views of some other embodiments of the germanium photodiode of FIG. 4.
Figure 6B:
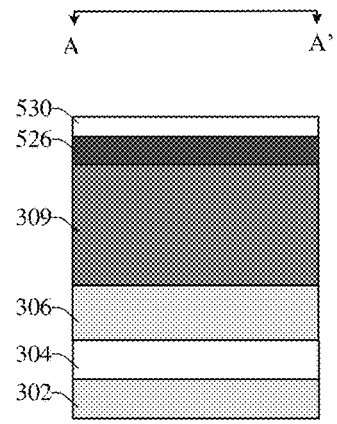

FIGS. 6A-6B shows an alternative embodiment where the germanium photodiode region 309 has a substantially rounded upper surface that includes a (111) facet, a (311) facet, and a (100) facet that collectively approximate a rounded surface. In some cases, the (111) facet and (311) facet appear due to the inner sidewalls of the oxide layer 310 constraining the epitaxial and selective growth of the germanium photodiode region 309. Because the growth rate of the (100) facet is higher than (311) and (111) facets; and the growth rate of the (311) facet is higher than that of the (111) facet, the selectively germanium grown gives rise to the generally rounded surface of FIG. 14B.

FIGS. 7A-7B illustrates another embodiment where the germanium photodiode region 309 has a substantially flat or level lower surface, vertical or substantially vertical sidewalls, and a curved upper surface. A silicon cap 526 is again disposed over the germanium photodiode region 309, and there is an absence of oxidation between the curved upper surface of the germanium photodiode region 309 and the lower surface of the silicon cap 526. In addition, an interface layer 528 comprising silicon germanium is disposed between the curved upper surface of the germanium photodiode region 309 and the lower surface of the silicon cap 526. In some embodiments, the silicon germanium of the interface layer 528 has a thickness ranging from approximately 3% of the thickness of the silicon cap 526 to approximately 50% of the thickness of the silicon cap 526. In some embodiments, the thickness of the silicon germanium ranges from 30 angstroms to 50 angstroms. In some alternative embodiments, the thickness of the silicon germanium is more than 0 angstrom and less than 30 angstroms. Further, the % of germanium by atomic ratio in the interface layer 528 is greater than 0% and less than or equal to 50% in some embodiments. In some embodiments, the interface layer 528 has a substantially constant atomic ratio of silicon to germanium throughout the entire thickness of the interface layer—for example the atomic ratio can be 1:1 for silicon:germanium from the upper surface of the germanium photodiode region 309 to the lower surface of the silicon cap 526.

FIGS. 8A-8B illustrate another embodiment where the interface layer 528 comprises silicon germanium. Compared to FIGS. 7A-7B where the interface layer 528 has a substantially constant atomic ratio of silicon to germanium throughout its thickness, the atomic ratio of silicon to germanium in FIGS. 8A-8B is graded over the thickness of interface layer 528. Thus, in FIGS. 8A-8B, the percentage of silicon by atomic ratio ranges from approximately 0% near the bottom to about 100% to the top, and can exhibit a linearly increasing percentage of silicon by atomic ratio (and percentage of germanium can correspondingly decrease) over this thickness. In other embodiments, the percentage of silicon by atomic ratio can increase (and percentage of germanium can correspondingly decrease) according to a quadratic function that various continuously over the thickness, an exponential function that varies continuously over the thickness, or another continuous function; this is because continuous functions tend to control lattice strain and provide better crystalline structure than discrete, step-like changes in composition, which are also possible. Further, in some embodiments, the percentage of silicon germanium by atomic ratio ranges from approximately 100% near the bottom to about 0% to the top, and exhibits an increasing percentage of silicon by atomic ratio over this thickness. In some cases, the thickness of the interface layer 528 is approximately equal to that of the silicon cap 526, however, the thickness of the interface layer 528 can also be greater than that of the silicon cap 526 or less than that of the silicon cap 526. In some embodiments, the thickness of the interface layer 528 ranges from 150 angstroms to 1000 angstroms.

Figure 9:
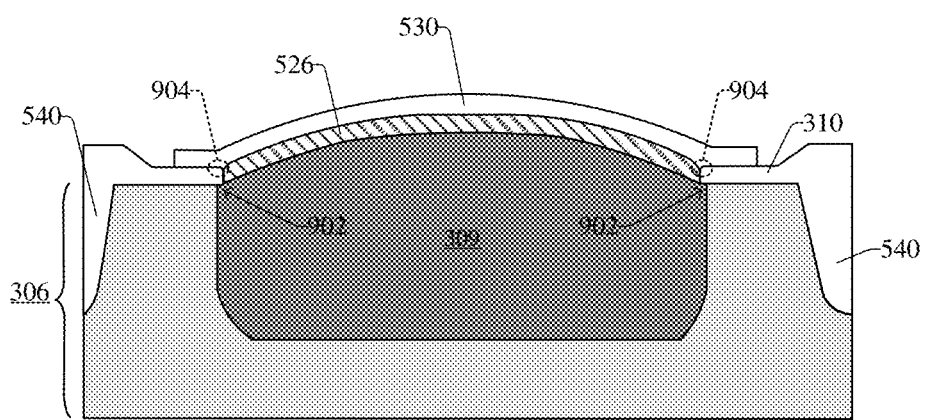
FIG. 9 illustrates another cross-sectional view of a photodiode in accordance with some embodiments.

FIG. 9 shows another example illustrating some details of how the germanium photodiode region 309, oxide layer 310, and silicon cap 526 meet one another in embodiments. As shown in FIG. 9, in some embodiments, peripheral regions of the germanium photodiode region 309 can undercut the inner sidewalls of the oxide layer 310 (see 902). This is due to the process by which the germanium photodiode region 309 is formed, whereby a trench is formed in the substrate through etching that slightly undercuts the oxide layer 310, and the germanium photodiode region 309 is then epitaxially and selectively grown within the trench. An upper surface of the oxide layer 310 and inner sidewalls can also have rounded corners 904 due to the etch. A central region of the germanium photodiode region 309 has an upper surface that is raised above an upper surface of the oxide layer 310, and the silicon cap 526 is disposed over the germanium photodiode region 309. In some embodiments, the silicon cap 526 has a thickness that ranges from 75% to 125% of the thickness of the oxide layer 310, and has the same thickness (plus or minus 5%) as the oxide layer 310 in some cases. A lower surface of the central region of the silicon cap 526 is raised above the upper surface of the oxide layer 310. The protective oxide layer 530 is disposed over the silicon cap, and has outer edges that are approximately 50% between an outer edge of the germanium photodiode region and an inner edge of the STI structure 540.

With reference to FIGS. 10-18, a series of cross-sectional views 1000-1800 of some embodiments of a method for forming an optoelectronic device is provided in which a silicon cap layer is disposed over a germanium photodiode to reduce dark current.

Figure 10:
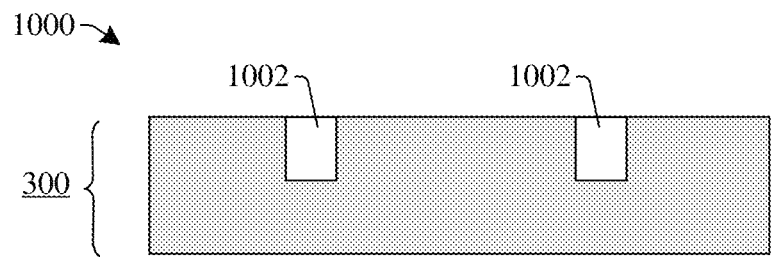
FIGS. 10-19 illustrate a series of cross-sectional views that collectively depict a method of manufacturing a photodiode in accordance with some embodiments.

As illustrated by the cross-sectional view 1000 of FIG. 10, a substrate 300 is provided. The substrate 300 may, for example, be a bulk substrate of monocrystalline silicon or some other suitable type of substrate, such as an SOI substrate, among others. In some embodiments, the substrate 300 is un-doped. In other embodiments, the substrate 300 is doped with P-type or N-type dopants. The substrate 300 is patterned to form shallow trench isolation (STI) regions that extend into an upper surface of the substrate. The patterning to form the STI regions can comprise: 1) depositing a hard mask layer over the substrate 300; 2) patterning the hard mask layer by a photolithography/etching process; and 3) performing an etch into the substrate 300 with the hard mask layer in place. The hard mask layer may, for example, be or comprise silicon nitride, un-doped silicate glass (USG) and/or some other suitable dielectric(s). The trench is the filled in with an insulating material, such as silicon dioxide or a low-k dielectric material for example. Optionally, a chemical mechanical planarization (CMP) operation is carried out to planarize an upper surface of the STI regions with the upper surface of the substrate 300.

Figure 11:
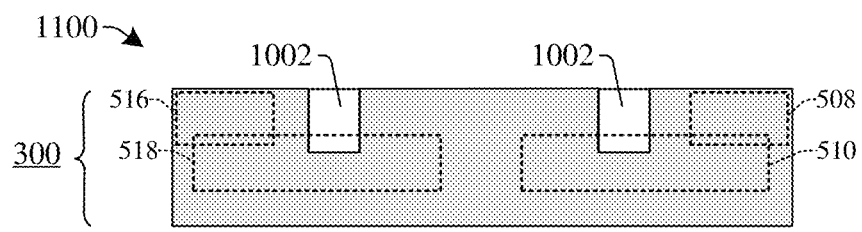

As illustrated by the cross-sectional view 1100 of FIG. 11, p-type and n-type regions are formed in the substrate 300. In some embodiments, the forming comprises: selectively performing ion implantation into the substrate 300 to form the p-type contact region 516; selectively performing ion implantation into the substrate 300 to form the lateral p-type region 518; selectively performing ion implantation into the substrate 300 to form the n-type contact region 508; and selectively performing ion implantation into the substrate 300 to form the lateral n-type region 510.

Figure 12:
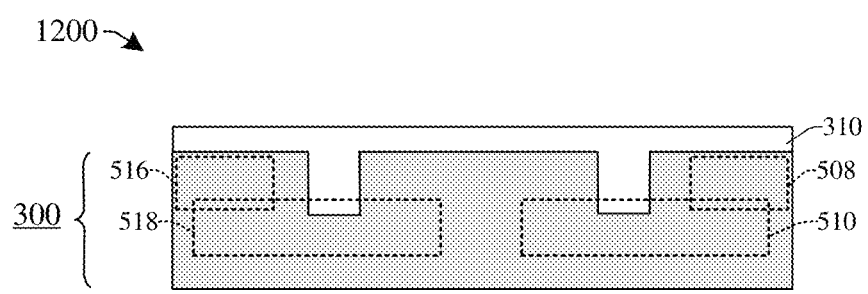

As illustrated by the cross-sectional view 1200 of FIG. 12, an oxide layer 310 is then formed over the upper surface of the substrate 300. The oxide layer 310 can be formed by a thermal oxidation, a spin on process, an atomic layer process, or a plasma deposition process, among others. In some embodiments, the oxide layer is a silicon dioxide layer, but can also be a low-k dielectric or another suitable dielectric.

As illustrated in cross-sectional view 1300, the substrate 300 is then patterned to form a recess or trench 1302. The patterning to form the trench 1302 comprise: depositing a hard mask layer 1304 over the substrate 300; patterning the hard mask layer 1304 by a photolithography/etching process; and performing an etch into the substrate 300 with the hard mask layer 1304 in place. The hard mask layer 1304 may, for example, be or comprise silicon nitride, un-doped silicate glass (USG) and/or some other suitable dielectric(s). In alternative embodiments, the patterning to form the trench 1302 is performed by some other suitable patterning process. In some embodiments, the etch may undercut the inner sidewalls of the oxide layer 310 (see lines 1306) so the inner edges of the oxide layer 310 overhang the outermost edges of the trench 1302.

Figure 13:
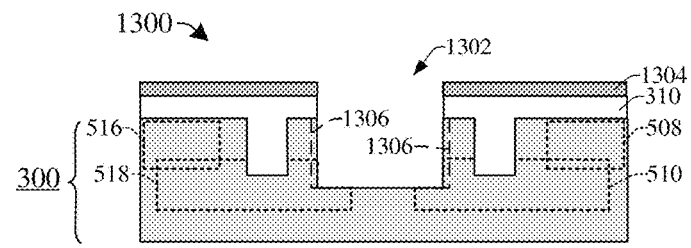
Figure 14A:
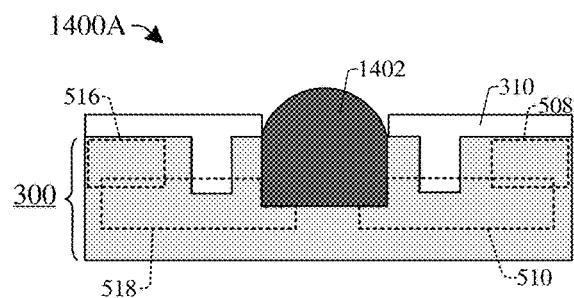
Figure 14B:
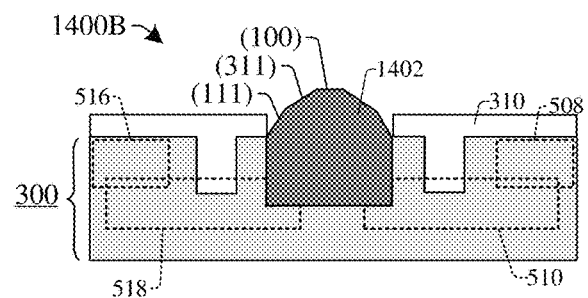

As illustrated by the cross-sectional views 1400A-1400B of FIG. 14A-14B, respectively, a germanium region 1402 is epitaxially grown filling the trench 1302 (see, e.g., FIG. 13). Because the germanium region 1402 is epitaxially grown, the germanium region 1402 is selective to grow only on the silicon and grows outward from exposed surfaces of the substrate 300 in the trench 1302. Further, because the hard mask layer 1304 covers the substrate 300 outside the trench 1302, the germanium region 1402 is wholly or mostly localized to the trench 1302. Other suitable materials are, however, amenable in alternative embodiments. Further, in some embodiments, the germanium region 1402 has a smaller bandgap than the substrate 300. In some embodiments, the germanium region 1402 can have a generally rounded upper surface, which in some cases exhibits an absence of sharp corners or that includes several planar facets that collectively approximate a rounded surface. For example, FIG. 14A shows a germanium region 1402 with a rounded upper surface that exhibits an absence of sharp corners, while FIG. 14B shows a germanium region 1402 with a (111) facet, a (311) facet, and a (100) facet that collectively approximate a rounded surface. In some cases, the (111) facet and (311) facet appear due to the inner sidewalls of the oxide layer 310 that define an uppermost portion of trench 1302 and the fact the germanium grows selectively on the substrate 300 but not this oxide layer 310. Because the growth rate of the (100) facet is higher than (311) and (111) facets; and the growth rate of the (311) facet is higher than that of the (111) facet, the selectively germanium grown gives rise to the generally rounded surface of FIG. 14B. Whether the upper surface is rounded and exhibits an absence of sharp corners as in FIG. 14A or includes several planar facets as in FIG. 14B, the generally rounded upper surface can ultimately help to facilitate total internal reflection of light within the germanium photodiode region.

Figure 15A:
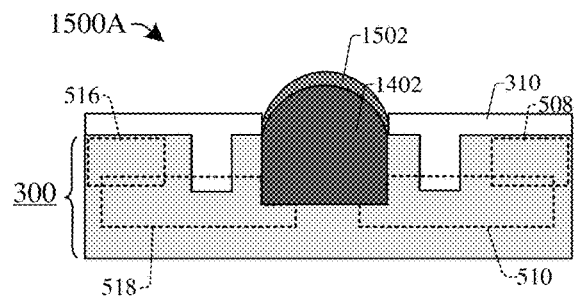
Figure 15B:
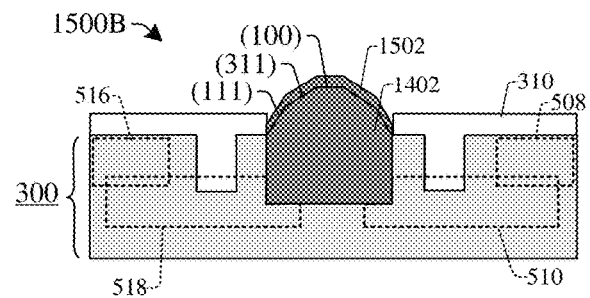
Figure 16A:
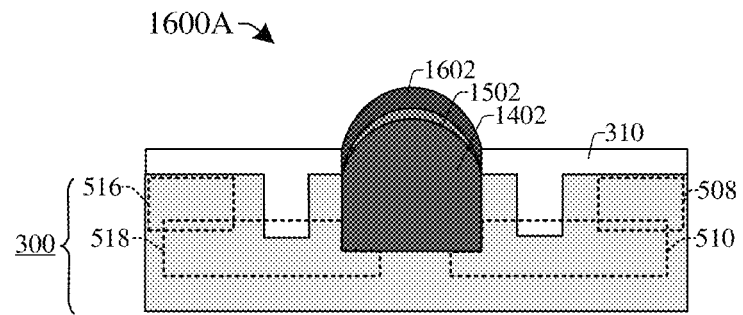
Figure 16B:
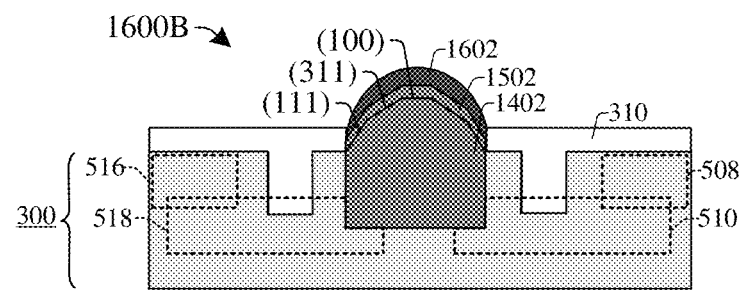
Figure 16C:
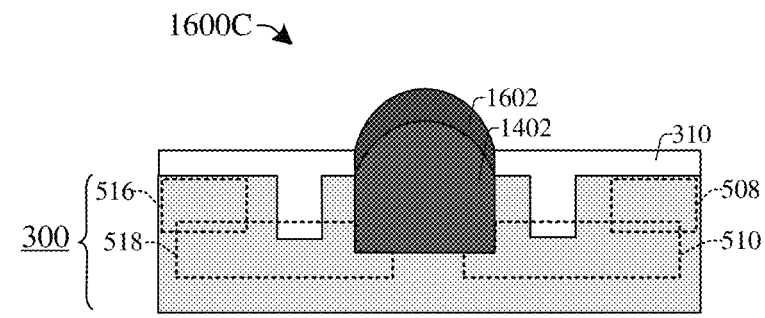

As illustrated by the cross-sectional views 1500A-1500B of FIGS. 15A-15B and 1600A-1600C of FIGS. 16A-16C, a cap layer is epitaxially grown on and covers the generally rounded upper surface of the germanium region 1402. The cap layer may include a silicon cap layer 1602 (see FIGS. 16A-16C) over the upper rounded surface of the germanium region 1402, and may optionally include an interface layer 528 (see FIGS. 15A-15B) between the silicon cap layer 1602 and the germanium region 1402. Further, the cap layer is epitaxially grown, such that the cap layer grows on the germanium region 1402 but not the hard mask layer 1104. As such, the cap layer is localized to the germanium region 1402 by a self-aligned process, and can save a photomask compared to some other approaches. Further, the cap layer is grown in-situ with the germanium region 1402 (meaning the cap layer is formed in the same cluster tool, or in even in the same chamber within a cluster tool, as the germanium region 1402 without exposing the substrate and germanium region to an ambient environment external to the cluster tool), such that the substrate and germanium region is well protected from the ambient environment. This in-situ processing helps prevent oxidation of the rounded upper surface of the germanium region 1402, whereby such oxidation would otherwise increase dark current in the resulting germanium photodiode. Therefore, this in-situ processing of the germanium region 1402, optional silicon germanium interface layer 1502, and silicon cap layer 1602 results in an absence of oxidation between the rounded upper surface of the germanium region 1402 and the uppermost surface of the silicon cap layer 1602. In some regards, this in-situ processing has showed a significant reduction in dark current compared to other approaches that do not use this in-situ processing. For example, in some embodiments, a germanium photodiode with a silicon cap formed by in-situ processing, when having an applied voltage of −2 volts, an input power before the photodiode of 0.2 milliwatts (mW), an 3 dB bandwidth of 60 GHz), and an output current of 214 microamps, had a dark current of less than 20 nanoamps (nA), which is a reduction in dark current of more than 20 times compared to other approaches. This reduction in dark current is believed to arise because the lack of oxidation over the upper surface of the germanium region 1402 provides less interface charge than if the oxidation were present, and thus provides a significant improvement over other approaches.

More particularly in FIG. 15A, a silicon germanium interface layer 1502 is formed on the rounded upper surface of the germanium region 1402. The silicon germanium interface layer 1502 can be formed by an epitaxial growth process in situ with the germanium region 1402. In FIG. 15A, the silicon germanium interface layer 1502 can have a constant atomic ratio over its entire thickness, or can have an atomic ratio of silicon to germanium that changes over its thickness. In FIG. 15B, the silicon germanium interface layer 1502 has facets that conform to underlying facets in the germanium region 1402; and can have a constant atomic ratio over its entire thickness, or can have an atomic ratio of silicon to germanium that changes over its thickness. In some embodiments, the silicon germanium interface layer 1502 may be formed by introducing silicon germanium precursors in to the chamber to grow silicon germanium on the outer surface of the germanium region 1402, and has a thickness ranges from 30 angstroms to 50 angstroms. In some alternative embodiments, the silicon germanium interface layer 1502 may be formed by introducing silicon precursors to react with germanium of the germanium region 1402, and has a thickness more than 0 angstroms and less than 30 angstroms.

In FIGS. 16A-16C, a silicon cap layer 1602 is formed over the germanium region 1402. Again, the silicon cap layer 1602 is formed epitaxially and selectively, and in situ with the germanium region 1402 and the silicon germanium interface layer 1502 (if present). More particularly, in FIGS. 16A-16B, which follow from FIGS. 15A-15B, respectively, the silicon cap layer 1602 is formed over the silicon germanium interface layer 1502. In FIG. 16C, the silicon cap layer 1602 is formed directly over the germanium region 1402 with no intervening silicon germanium interface layer. The silicon cap layer 1602 protects the germanium region 1402 from damage during subsequent processing. For example, subsequent wet cleaning processes may use acids that have high etch rates for the germanium region 1402 but low etch rates for the silicon cap layer 1602. As such, the germanium region 1402 would undergo significant crystalline damage and/or erosion but for the silicon cap layer 1602. By preventing erosion and/or crystalline damage, leakage current is reduced.

Figure 17:
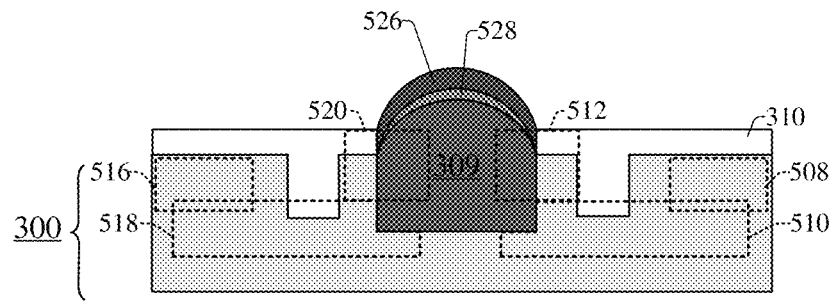

As illustrated by the cross-sectional view 1700 of FIG. 17 (which follows from FIG. 16A, but could also follow from FIGS. 16B-16C), the germanium region 1402 and the silicon cap 526 are doped to form a germanium photodiode region 309. Germanium photodiode region 309 comprises a p-i-n photodiode in the illustrated embodiment, but in other embodiments can comprise a PN photodiode. The p-i-n photodiode comprises a p-type photodiode region 520 and an N-type photodiode region 512. To perform this doping, the substrate is removed from the cluster tool in which the germanium region 1402 and cap layer are formed, and is typically exposed to the ambient environment of the fab in being transferred to an ion implantation tool where the doping is performed. Thus, the top of the silicon cap layer 1602 may be oxidized at this point, but the underlying upper rounded surface of the germanium photodiode region 309 remains oxidation free to keep dark current at reduced levels.

Figure 18:
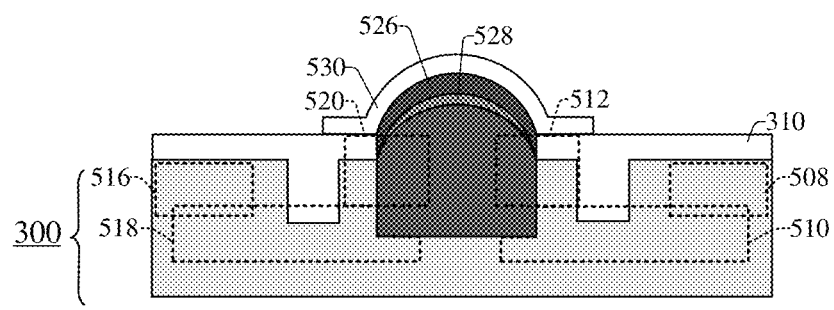

As illustrated by the cross-sectional view 1800 of FIG. 18, a protective oxide layer 530 is formed directly on the silicon cap 526 and over the inner edges of the oxide layer 310 nearest the germanium photodiode region 309. In some embodiments, the protective oxide layer 530 comprises silicon oxide, and/or is a high k dielectric material with a dielectric constant in excess of 3.9, 10, or some other suitable value. The deposition may, for example, be performed by atomic layer deposition (ALD), vapor deposition, or some other suitable deposition process. In some embodiments, the protective oxide layer 530 is a metal oxide. Other suitable materials are, however, amenable. In some embodiments, the protective oxide layer 530 is or comprises aluminum oxide (e.g., $Al_2O_3$), titanium oxide (e.g., $TiO_2$), tantalum oxide (e.g., $Ta_2O_5$), hafnium oxide ($HfO_2$), zirconium oxide (e.g., $ZrO_2$), magnesium oxide (e.g., MgO), some other suitable high k dielectric(s), or any combination of the foregoing. In some embodiments, the protective oxide layer 530 has a thickness of about 1-10 nanometers, about 1-5 nanometers, about 5-10 nanometers, or some other suitable value.

Figure 19:
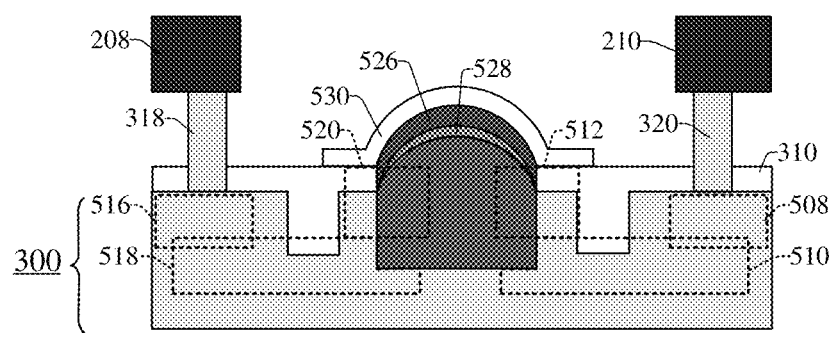

As illustrated by the cross-sectional view 1900 of FIG. 19, contacts 320, 318 are formed to connect the contact regions 508 and 516, respectively, to metal lines 210, 208, respectively. In some embodiments, the metal contacts and metal lines comprise copper, aluminum, nickel, lead, and/or tungsten, among other metals.

Figure 20:
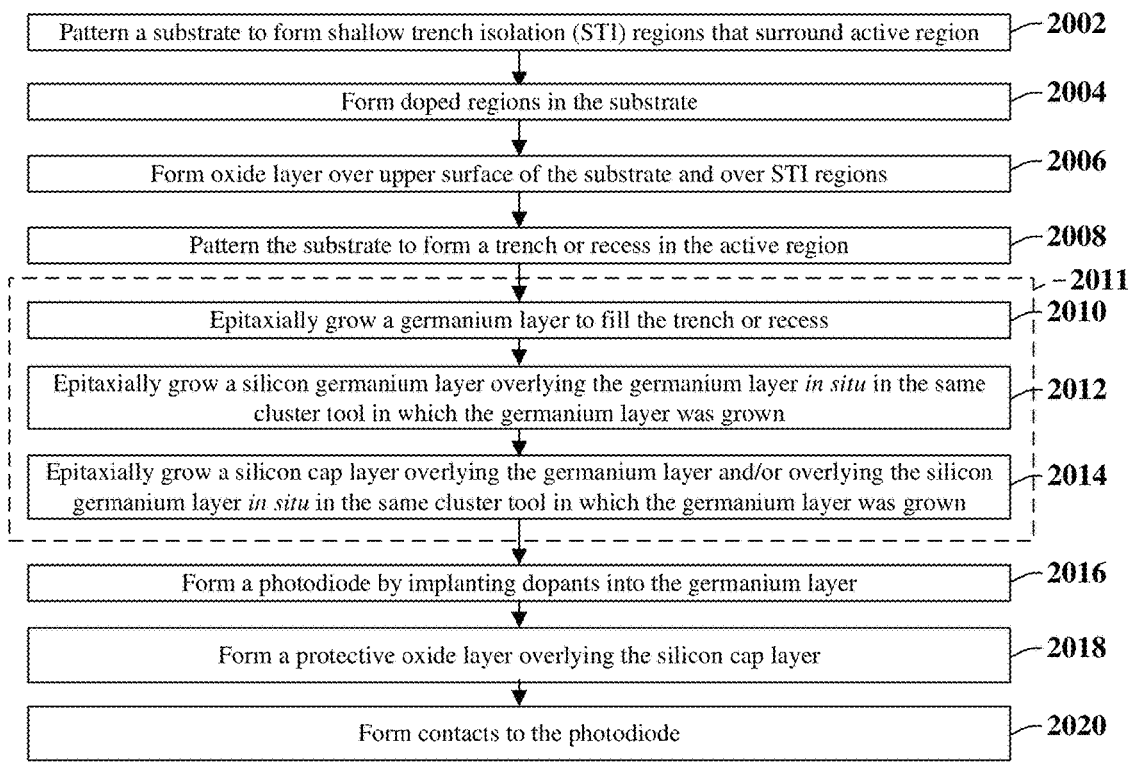
FIG. 20 illustrates a block diagram of some embodiments of the method of FIGS. 10-19.

FIG. 20 illustrates some embodiments of methods 2000 for manufacturing an optoelectronic device in accordance with some embodiments. While examples of FIG. 20 are mentioned with reference to the preceding cross-sectional views of FIGS. 10-19, it will be appreciated that the structures shown in FIGS. 10-19 are not limited to the methods 2000 but rather may stand alone separate of the methods. Further, while methods 2000 are described as a series of acts, it will be appreciated that the order of the acts (and/or portions of those acts) may be altered in other embodiments. For example, although FIG. 20 illustrates that a photodetector is formed by implanting dopants into the germanium layer in act 2016, the dopants could also be implanted after 2018 or before 2014 in some embodiments, and other doped regions in 2004 could also be performed at other times in the method 2000. Further still, while FIG. 20 illustrates a specific series of acts, some acts that are illustrated and/or described may be omitted in other embodiments. Further, additional acts that are not illustrated and/or described in FIG. 20 may be included in other embodiments.

At act 2002, a substrate is patterned to form shallow trench isolation (STI) regions that surround an active region. In some embodiments, act 2020 can be consistent with FIG. 10.

At act 2004, doped regions are formed in the substrate. In some embodiments, act 2004 can be consistent with FIG. 11.

At act 2006, an oxide layer is formed over an upper surface of the substrate and over the STI regions. In some embodiments, act 2006 can be consistent with FIG. 12.

At act 2008, the substrate is etched to form a trench or recess in the active region. In some embodiments, act 2008 can be consistent with FIG. 13.

At act 2010, a germanium layer is epitaxially grown to partially or entirely fill the trench or recess. In some embodiments, act 2010 can be consistent with FIGS. 14A-14B.

At act 2012, which is optional, a silicon germanium layer is formed to overlie the germanium layer in situ in the same cluster tool in which the germanium layer was grown. In some embodiments, act 2012 can be consistent with FIGS. 15A-15B. Box 2011 indicates these acts may be performed in-situ in the same cluster tool.

At act 2014, a silicon cap layer is grown to overlie the germanium layer and/or overlie the silicon germanium layer in situ in the same cluster tool in which the germanium layer was grown. In some embodiments, act 2014 can be consistent with FIGS. 16A-16C.

At act 2016, a photodiode is formed by implanting dopants into the germanium layer.

In some embodiments, act 2016 can be consistent with FIG. 17.

At act 2018, a protective oxide layer is formed over the silicon cap layer. In some embodiments, act 2018 can be consistent with FIG. 18.

At act 2020, contacts to the photodiode are formed. In some embodiments, act 2020 can be consistent with FIG. 19.

In some embodiments, the present disclosure relates to an optoelectronic device, comprising: a substrate, and a germanium photodiode region extending into an upper surface of the substrate. The germanium photodiode region has a curved upper surface that extends past the upper surface of the substrate. A silicon cap overlies the curved upper surface of the germanium photodiode region, and there is an absence of oxide between the curved upper surface of the germanium photodiode region and an upper surface of the silicon cap.

Other embodiments relate to a method. In the method, a trench is formed in a substrate, and the substrate, including the trench, is placed within a chamber. Within the chamber, a germanium layer is epitaxially grown in the trench to have a curved upper surface, and in situ within the chamber, a silicon cap layer is epitaxially grown over the germanium layer.

Still other embodiments relate to a method. In this method, a substrate is received, and a shallow trench isolation region is formed to surround an active region in the substrate. A doped region is formed in the substrate, and an oxide layer is formed over an upper surface of the substrate and over the shallow trench isolation region. The substrate is etched to form a trench or recess in the active region, and a germanium layer is epitaxially grown to partially or entirely fill the trench or recess. A silicon cap layer is then epitaxially formed to overlie the germanium layer. The silicon cap layer is formed in situ in a cluster tool in which the germanium layer was grown without exposing the germanium layer to an ambient environment surrounding the cluster tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optoelectronic device, comprising:
   a substrate;
   a germanium photodiode region extending into an upper surface of the substrate, wherein the germanium photodiode region has a curved upper surface that extends past the upper surface of the substrate; and
   a silicon cap overlying the curved upper surface of the germanium photodiode region, wherein there is an absence of oxide between the curved upper surface of the germanium photodiode region and an upper surface of the silicon cap, and wherein the silicon cap contacts and covers a curved portion of the curved upper surface of the germanium photodiode region.

2. The optoelectronic device according to claim 1, further comprising:
   a silicon germanium interface layer disposed over the germanium photodiode region and separating the curved upper surface of the germanium photodiode region and a lower surface of the silicon cap.

3. The optoelectronic device according to claim 2, wherein the silicon germanium interface layer has a constant atomic ratio of silicon to germanium throughout a thickness of the silicon germanium interface layer.

4. The optoelectronic device according to claim 2, wherein the silicon germanium interface layer has a changing atomic ratio of silicon to germanium over a thickness of the silicon germanium interface layer, wherein an atomic ratio of silicon to germanium has a first value nearer the germanium photodiode region and a second value nearer the silicon cap, the second value being greater than the first value.

5. The optoelectronic device according to claim 1, further comprising:
   a protective oxide layer disposed over the silicon cap, the protective oxide layer having a curved upper surface over the silicon cap.

6. The optoelectronic device of claim 5, wherein the protective oxide layer has a central region over the germanium photodiode region and has outer edges that extend laterally over the upper surface of the substrate past outer sidewalls of the germanium photodiode region.

7. The optoelectronic device of claim 5, further comprising:
   an isolation structure comprising oxide extending into the upper surface of the substrate on opposite sides of the germanium photodiode region.

8. The optoelectronic device of claim 7, further comprising:
   a p-type region to a first side of the germanium photodiode region and at a first location laterally beyond a first outer sidewall of the isolation structure furthest from the germanium photodiode region; and
   an n-type region to a second side of the germanium photodiode region and at a second location laterally beyond a second outer sidewall of the isolation structure furthest from the germanium photodiode region; and
   wherein the p-type region, the n-type region, and the germanium photodiode region establish a p-n photodiode or a p-i-n photodiode.

9. An integrated circuit, comprising:
   a substrate;
   a shallow trench isolation region including a pair of trenches extending into an upper surface of the substrate when viewed in cross-section, the pair of trenches laterally surrounding an inner portion of the substrate when viewed in the cross-section;
   an oxide layer over an upper surface of the substrate and disposed in the shallow trench isolation region;
   a germanium layer extending into an upper surface of the inner portion of the substrate and laterally surrounded by the shallow trench isolation region, wherein the inner portion of the substrate separates the germanium layer and the pair of trenches;
   a silicon cap layer overlying the germanium layer; and
   a silicon germanium interface layer overlying the germanium layer and on a lower portion of the silicon cap layer.

10. The integrated circuit of claim 9, wherein the germanium layer extends along a linear segment through the substrate.

11. The integrated circuit of claim 10, wherein the germanium layer comprises a rounded upper surface that extends axially over the linear segment.

12. The integrated circuit of claim 11, wherein the germanium layer comprises a body and distal ends arranged along the linear segment, wherein at least one of the distal ends of the germanium layer contacts a silicon core that extends into an upper surface of the substrate.

13. The integrated circuit of claim 12, wherein the at least one of the distal ends where the germanium layer contacts the silicon core has a tapered shape, such that the at least one of the distal ends is narrower than the body of the germanium layer.

14. The integrated circuit of claim 10, wherein the germanium layer includes a p-type region, an n-type region, and a junction region arranged between the p-type region and the n-type region.

15. The integrated circuit of claim 14, wherein the junction region extends in parallel with or is co-linear with the linear segment.

16. The integrated circuit of claim 9, further comprising:
a p-type region to a first side of the germanium layer and at a first location laterally beyond a first outer sidewall of the shallow trench isolation region furthest from the germanium layer; and
an n-type region to a second side of the germanium layer and at a second location laterally beyond a second outer sidewall of the shallow trench isolation region furthest from the germanium layer.

17. An optoelectronic device, comprising:
a substrate;
a germanium region extending into an upper surface of the substrate, wherein the germanium region has a curved upper surface that extends past the upper surface of the substrate;
a silicon cap over the curved upper surface of the germanium region, wherein there is an absence of oxide between the curved upper surface of the germanium region and an upper surface of the silicon cap;
an isolation structure extending into the upper surface of the substrate on opposite sides of the germanium region;
a p-type region to a first side of the germanium region and at a first location laterally beyond a first outer sidewall of an isolation structure furthest from the germanium region; and
an n-type region to a second side of the germanium region and at a second location laterally beyond a second outer sidewall of the isolation structure furthest from the germanium region.

18. The optoelectronic device according to claim 17, further comprising:
a silicon germanium interface layer disposed over the silicon cap and separating the curved upper surface of the germanium region and a lower surface of the silicon cap.

19. The optoelectronic device according to claim 18, wherein the silicon germanium interface layer has a constant atomic ratio of silicon to germanium throughout a thickness of the silicon germanium interface layer.

20. The optoelectronic device according to claim 18, wherein the silicon germanium interface layer has a changing atomic ratio of silicon to germanium over a thickness of the silicon germanium interface layer, wherein an atomic ratio of silicon to germanium has a first value nearer the germanium region and a second value nearer the silicon cap, the second value being greater than the first value.

* * * * *